United States Patent [19]

Taylor

[11] Patent Number: 4,622,479
[45] Date of Patent: Nov. 11, 1986

[54] BOOTSTRAPPED DRIVER CIRCUIT FOR HIGH SPEED APPLICATIONS

[75] Inventor: Ronald T. Taylor, Dallas, Tex.

[73] Assignee: Thomson Components-Mostek Corporation, Carrollton, Tex.

[21] Appl. No.: 770,367

[22] Filed: Aug. 29, 1985

Related U.S. Application Data

[63] Continuation of Ser. No. 449,792, Dec. 14, 1982.

[51] Int. Cl.[4] .................... H03K 4/58; H03K 19/017; H03K 17/04; H03K 19/096
[52] U.S. Cl. .................................. 307/482; 307/578; 307/270; 307/450
[58] Field of Search ................ 307/450, 482, 578, 270

[56] References Cited

U.S. PATENT DOCUMENTS

| | | | |
|---|---|---|---|
| 3,631,267 | 12/1971 | Heimbigner | 307/482 X |
| 3,912,948 | 10/1975 | Bapat | 307/482 X |
| 4,035,662 | 7/1977 | Kuo | 307/481 |
| 4,042,838 | 8/1977 | Street et al. | 307/482 X |
| 4,049,979 | 9/1977 | Shieu et al. | 307/482 X |
| 4,063,117 | 12/1977 | Laugesen et al. | 307/270 |
| 4,330,719 | 5/1982 | Nagami | 307/578 X |
| 4,398,100 | 8/1983 | Tobita et al. | 307/578 X |
| 4,488,061 | 12/1984 | Mukawa et al. | 307/270 X |

OTHER PUBLICATIONS

Knepper, "Dynamic Depletion Mode: An E/D Mosfet Circuit Method for Improved Performance", *IEEE JSSC*, vol. SC13, No. 5, pp. 542-548, Oct. 1978.

Hardee et al, "A Fault-Tolerant 30 ns/375 mW 16Kxl NMOS Static Ram", *IEEE JSSC*, vol. SC-16, No. 5, pp. 435-443, Oct. 1981.

*Primary Examiner*—Stanley D. Miller
*Assistant Examiner*—D. R. Bertelson
*Attorney, Agent, or Firm*—Roland Plottel

[57] ABSTRACT

An improved integrated circuit driver circuit switches a relatively large load at high speed by means of a bootstrapping capacitor that bootstraps an output transistor a fixed time after the transistor has started to drive the load.

2 Claims, 1 Drawing Figure

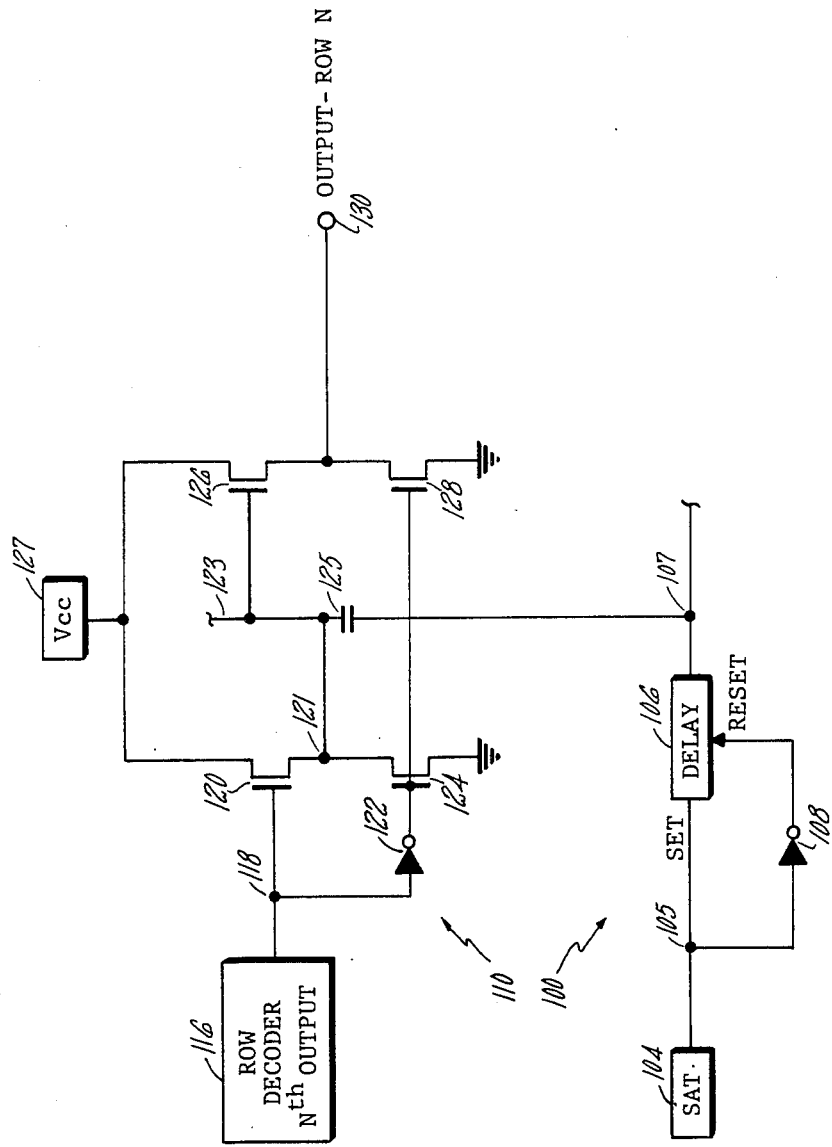

BOOTSTRAPPED DRIVER CIRCUIT FOR HIGH SPEED APPLICATIONS

This application is a continuation of U.S. Ser. No. 449,792, filed Dec. 14, 1982.

DESCRIPTION

1. Technical Field

The field of the invention is that of integrated circuits having driver circuits that must switch at a high speed.

2. Background Art

Large-scale integrated circuits typically have low power internal circuits which are able to switch quickly from one state to another because of the low power and low capacitance involved. These circuits need driver circuits to drive high capacitance loads at a higher current and therefore need to switch a high current within the specification of the system. Typically, it is necessary to switch a load from ground to the power supply voltage VCC within a specified time. It is known to do this with driver circuits which consume a certain amount of DC power but large-scale circuits that are currently being produced cannot tolerate the power dissipation caused by having a large number of output circuits that consume power continuously. If the gate of the output transistor is connected to VCC, then the output load will rise to a value of VCC−VT (the threshold voltage) and the switching time will be long because, as the output rises to the final value the transistor's output current decreases because there is a smaller voltage difference between the gate and the source and the current decreases with the usual exponential time dependence of a capacitor being charged. One solution used in the prior art, in the particular case of a driver circuit in a static RAM, is to put a clock circuit on each driver output. This approach requires a clock delay time and also requires a large amount of layout area and so is not suited for large-scale chips.

An article by Sud and Hardee in JSSC, Vol SC-16, No. 5, October 1981 discloses a bootstrap row decoder. That circuit does not lend itself to efficient layout, as it is nonplanar and the bootstrap capacitor cannot be fully charged, requiring a larger size capacitor. In addition, additional switching capacitances slow the circuit down.

DISCLOSURE OF INVENTION

The invention relates to a circuit between a logical output on a large-scale integrated circuit chip and a driver circuit feeding a load in which the driver circuit charges the load immediately and, a fixed time later, then bootstraps the gate of the driving transistor to a voltage above the power supply voltage in order to improve the driving process.

BRIEF DESCRIPTION OF THE DRAWING

The single figure illustrates a schematic diagram of an embodiment of the invention.

BEST MODE FOR CARRYING OUT THE INVENTION

The bootstrapped driver circuit of the invention may be employed with a number of integrated circuit devices. The figure illustrates a particular application to the row driver circuit of a static RAM in which circuit 100 on the lower portion of the diagram includes a conventional SAT (Sense Address Transition) circuit 104 the output of which is delayed by delay circuit 106 and is propagated to all row driver circuits including one particular driver circuit shown generally as number 110 in the figure. This circuit comprises row decoder 116 which generates a signal corresponding to the Nth row line of memory matrix. This decoder is connected through the novel circuit to row line 130 which is to drive other circuits within the system. The connection between decoder circuit 116 and output 130 and the timing relationship between the switching voltage of row decoder N and the signal from the SAT circuit form the subject of the invention.

In operation, node 118 at the output of circuit 116 is normally low, since row N is normally not selected. The output of inverter 122 is normally high and is connected to the gate of transistor 124, which is therefore normally on. Since transistor 124 is connected between ground and node 121, node 121 is normally at a low voltage determined by the threshold of transistor 124. Thus, the gate of transistor 126 is normally low and transistor 126 is normally off, so that output 130 is normally low. The output of inverter 122 is also connected to the gate of output transistor 128, which, in turn, is tied to ground the bus; so that output node 130 is held at lower ground potential. Transistor 120 is connected between node 121 and the bus which is connected to power supply 127. Its gate is controlled by node 118 and therefore transistor 120 is normally off. When row N is selected by external circuitry, the voltage on node 130 must rise from ground level to a high voltage at or near VCC in a specified time and remain at that voltage until shut off by a control signal from another external device. The problem addressed by this invention is making that transition within a very short time without consuming a large amount of power. If node 118 were connected directly to the gate of output transistor 126 (and transistors 120 and 124 and capacitor 125 were not in the circuit) and node 118 merely switched logic levels without bootstrapping, then node 130 would rise to a voltage level of VCC−VT. If transistor 126 were a depletion device instead of an enhancement device, node 130 could rise to VCC, but the circuit would consume too much power.

According to the invention, SAT circuit 104 has an output connected to node 105 which is normally high. When one or more address buffers of the RAM senses a command from an external device, SAT circuit 104 responds to the change of state and goes low while the internal logic in the decoder is making transistions. The construction of SAT circuit 104 is arranged so that the time for which output 105 is low is closely equivalent to the time taken to propagate the address change through the decoder and node 105 resumes its normally high state at the time when node 118 switches from its normally low state to the high state. Node 107 at the output of delay circuit 106 is normally high and is brought low shortly after SAT circuit 104 switches to the low state. Inverter 108 responds to the change in node 105 to reset delay circuit 106, thereby bringing node 107 low. When node 105 resumes its normally high state, delay circuit 106 is set (being connected to node 105) and node 107 is held low for the duration of the delay of circuit 106.

When node 118 goes high, at nearly the same time that node 107 goes low, transistor 120 is turned on, exposing node 121 to the power supply voltage VCC at the same time that transistor 124 is turned off and node 121 rises to the value VCC−VT. At the same time, node 107 on the opposite end of capacitor 125 is low so that capacitor 125 is charged to a state which reflects the voltage across it. As capacitor 125 is charged up and as node 121 passes the value VT, the threshold voltage of the transistor 126, transistor 126 starts to conduct so that output 130 starts to rise. If left by itself, node 121 would rise to a voltage VCC–VT at a rate which is determined by the value of capacitor 125 and the stray capacitance of the circuit. At the end of the time delay of circuit 106, however, node 107 rises to its normally high value so that capacitor 125 passes a positive pulse which raises node 121 to a voltage above VCC. This increased voltage increases the degree to which transistor 126 is turned on, thereby preventing the decrease in current flow that was a problem in the prior art. Thus, output transistor 126 is bootstrapped by propagation of a positive pulse through capacitor 125 into node 121. This bootstrapping causes node 130 to switch rapidly to the full value of VCC.

A contrast with the prior art bootstrapping circuit referred to above is that output transistor 128 has its gate tied to the gate of switching transistor 124, so that transistor 128 turns off quickly in comparison to the prior art. As a result of this different configuration of this circuit, the initial switching of output node 130 is not delayed, as it is in the prior art.

If only the components shown in the diagram were present in the circuit, the voltage on 121, which is greater than VCC, would fall back to the value VCC–VT at a rate determined by the leakage in the various components. Element 123 shown connected to node 121 leads to a separate circuit which generates high voltage by means of a charge pump or other conventional device known in the art. The on-chip power supply is sized to compensate for the leakage on the nodes and thus to maintain the selected nodes 121 at a value above VCC.

The output of SAT circuit 104, as delayed by delay 106, is distributed from node 107 to all the output driver lines. Only the selected row decoder output is bootstrapped since the transistors 124 and 128 of all the deselected rows are on and, therefore, the other circuits are not switching. The circuit is truly asynchronous since any noise applied to the address inputs at the input of the RAM resets the delay circuit 106 thereby extending the charging delay and since the signal path of the input, not shown in the figure, to the Nth output 116 is completely "ripple through". This feature is valuable for static RAM outputs, since a static RAM must respond at any time, regardless of its previous condition.

The particular embodiment illustated has been that of a row decoder on a static RAM, but circuits constructed according to the principles of the invention could be used for any application where an asynchronous or synchronous input requires a bootstrapped output.

I claim:

1. An integrated circuit comprising first, second, third, and fourth transistors, each having a pair of current-carrying electrodes and a gate electrode for controlling the current flow between the two current-carrying electrodes,
   means forming a first bus of high potential and a second bus of low potential,
   the first and second transistors being serially connected between said first bus and said second bus,
   the third and fourth transistors also being serially connected between the first bus and the second bus,
   an input logic circuit having an output node which in operation is normally low,
   means for supplying the output of the logic circuit to the gate of the first transistor and the inverse of said output to the gates of said second and fourth transistors,
   the node between the first and second transistors being connected to the gate of the third transistor,
   an output terminal,
   the node between the third and fourth transistors being connected to the output terminal,
   bootstrapping capacitor means having first and second terminals, of which the first is connected to the node between the first and second transistors and to the gate of the third transistor,
   delay means having an output node which is normally high in operation and which is connected to the second terminal of the bootstrapping capacitor means and receives an input signal ahead of the output of the input logic circuit for maintaining its output node low for a predetermined period of time and then returning high whereby a bootstrapping pulse is applied to the bootstrapping means.

2. An integrated circuit in accordance with claim 1 in which the input logic circuit is a row decoder circuit and the input signal of the delay means is supplied by a sense address transistion circuit and the output terminal is connected to a plurality of row driver circuits.

* * * * *